(12) United States Patent
Sasaki et al.

(10) Patent No.: US 8,319,463 B2
(45) Date of Patent: Nov. 27, 2012

(54) INVERTER APPARATUS, INVERTER CONTROL SYSTEM, MOTOR CONTROL SYSTEM, AND METHOD OF CONTROLLING INVERTER APPARATUS

(75) Inventors: Akira Sasaki, Kitakyushu (JP); Shoichiro Shimoike, Kitakyushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 151 days.

(21) Appl. No.: 12/964,751

(22) Filed: Dec. 10, 2010

(65) Prior Publication Data

US 2011/0080124 A1   Apr. 7, 2011

Related U.S. Application Data

(63) Continuation of application No. PCT/JP2009/054771, filed on Mar. 12, 2009.

(30) Foreign Application Priority Data

Sep. 11, 2008  (JP) .................................. 2008-233459

(51) Int. Cl.
*H02P 27/00* (2006.01)
*H02H 5/04* (2006.01)
*H05K 7/20* (2006.01)

(52) U.S. Cl. ..................... 318/400.3; 361/103; 361/105; 361/720

(58) Field of Classification Search ............... 318/400.3; 361/103, 105, 720
See application file for complete search history.

(56) References Cited

U.S. PATENT DOCUMENTS

| 6,835,483 | B2 * | 12/2004 | Ballantine et al. | 429/435 |
|---|---|---|---|---|
| 7,738,228 | B2 * | 6/2010 | Taylor | 361/103 |
| 8,022,650 | B2 * | 9/2011 | Itou et al. | 318/432 |
| 2004/0221217 | A1 * | 11/2004 | Sato et al. | 714/745 |
| 2006/0261830 | A1 * | 11/2006 | Taylor | 324/760 |
| 2007/0146951 | A1 * | 6/2007 | Takahashi et al. | 361/93.1 |

FOREIGN PATENT DOCUMENTS

| JP | 08-033104 | 2/1996 |
|---|---|---|
| JP | 10-164703 | 6/1998 |
| JP | 2002-345147 | 11/2002 |
| JP | 2003-014552 | 1/2003 |
| JP | 2003-134795 | 5/2003 |
| JP | 2003-134839 | 5/2003 |
| JP | 2005-184977 | 7/2005 |
| JP | 2005-218226 | 8/2005 |
| JP | 2006-304566 | 11/2006 |
| JP | 2007-215250 | 8/2007 |

OTHER PUBLICATIONS

International Search Report for International Application No. PCT/JP2009/054771, Jun. 16, 2009.
Written Opinion of the International Searching Authority for International Application No. PCT/JP2009/054771, Jun. 16, 2009.

* cited by examiner

*Primary Examiner* — Walter Benson
*Assistant Examiner* — Gabriel Agared
(74) *Attorney, Agent, or Firm* — Ditthavong Mori & Steiner, P.C.

(57) ABSTRACT

An inverter apparatus according to the invention includes a heat sink, an inverter that includes a semiconductor device and that is attached to the heat sink, detectors that detect the temperature of the inverter, an estimator that calculates estimated values of the thermal resistance and the thermal capacity of the heat sink on the basis of the temperature detected by the detectors, and a controller that controls driving of the inverter on the basis of the estimated values.

15 Claims, 5 Drawing Sheets

INVERTER APPARATUS, INVERTER CONTROL SYSTEM, MOTOR CONTROL SYSTEM, AND METHOD OF CONTROLLING INVERTER APPARATUS

CROSS-REFERENCE TO RELATED APPLICATIONS

The present application is a continuation application of PCT/JP2009/054771, filed Mar. 12, 2009, which claims priority to Japanese Patent Application No. 2008-233459, filed Sep. 11, 2008. The contents of these applications are incorporated herein by reference in their entirety.

BACKGROUND OF THE INVENTION

1. Field of the Invention

The present invention relates to an inverter apparatus and a method of controlling the same.

2. Discussion of Background

An example of existing technologies is described in Japanese Unexamined Patent Application Publication No. 2002-345147. The Publication describes a technology for calculating the surface temperature and the internal temperature of a motor by using a thermal model having generated heat and the ambient temperature as variables. The technology is used for providing protection under overload conditions (hereinafter referred to as "overload protection") while maintaining the maximum output power of a motor even when use conditions and the ambient temperature varies.

SUMMARY OF THE INVENTION

According to one aspect of the invention, an inverter apparatus includes a heat sink; a first detector that detects a temperature of the heat sink; an inverter including a power module including a semiconductor device, the inverter being attached to the heat sink; a second detector that detects a temperature of the power module; an estimator that calculates estimated values of a thermal resistance and a thermal capacity of the heat sink on the basis of the temperature detected by the second detector; and a controller that controls driving of the inverter on the basis of the estimated values.

According to another aspect of the invention, a method of controlling an inverter apparatus includes the steps of preparing a heat sink; attaching an inverter to the heat sink, the inverter including a power module including a semiconductor device; measuring a temperature of the heat sink; detecting a temperature of the power module; calculating estimated values of a thermal resistance and a thermal capacity of the heat sink on the basis of the temperature of the power module that has been detected; and limiting driving of the inverter on the basis of the estimated values.

According to another aspect of the invention, an inverter apparatus includes a heat sink; an inverter including a semiconductor device, the inverter being attached to the heat sink; a detector that detects a temperature of the inverter; an estimator including a storage that stores standard values of a thermal resistance and a thermal capacity of a standard heat sink, the estimator calculating estimated values of a thermal resistance and a thermal capacity of the heat sink on the basis of the temperature detected by the detector and the standard values; and a controller that protects the inverter from overload by limiting the driving of the inverter on the basis of the estimated values.

According to another aspect of the invention, a method of controlling an inverter apparatus includes the steps of attaching a heat sink to an inverter; measuring a temperature of the inverter; calculating estimated values of a thermal resistance and a thermal capacity of the heat sink on the basis of a temperature of the inverter that has been detected and standard values of a thermal resistance and a thermal capacity of a standard heat sink; and protecting the inverter from overload by limiting the driving of the inverter on the basis of the estimated values.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Embodiments will now be described with reference to the accompanying drawings, wherein like reference numerals designate corresponding or identical elements throughout the various drawings.

Figure 1:
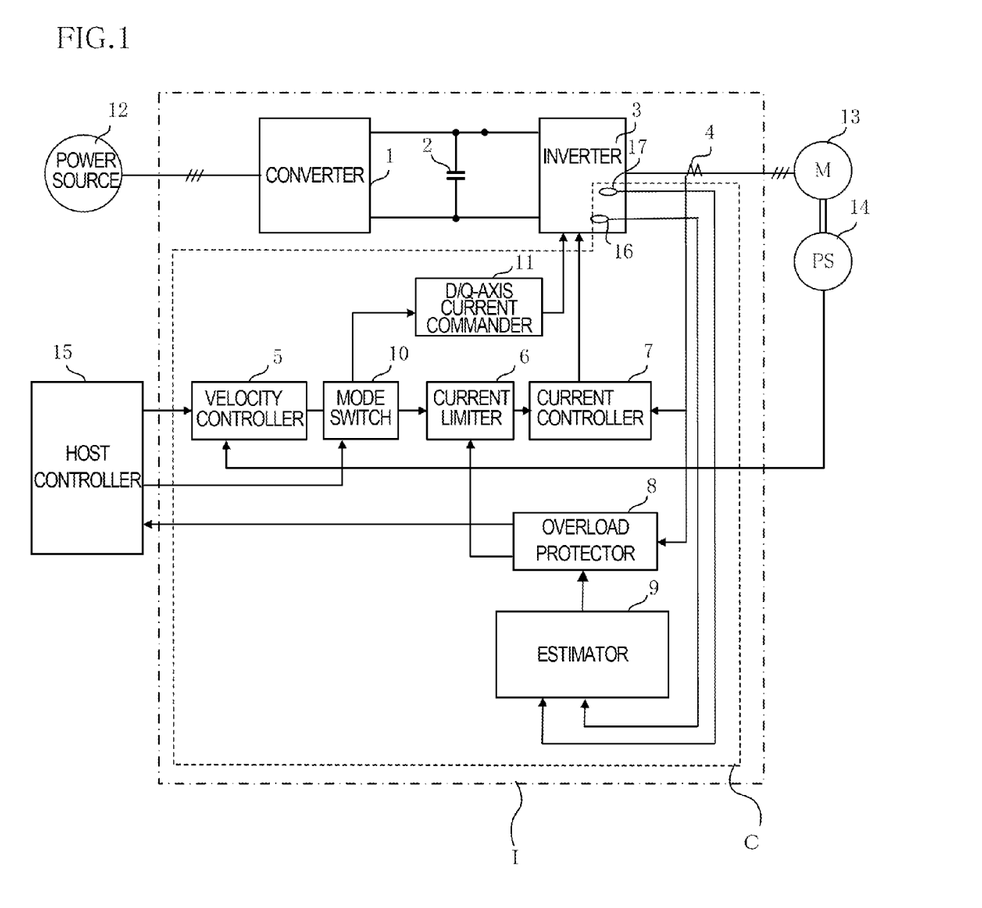
FIG. 1 is a block diagram of an embodiment of the present invention.

FIG. 1 illustrates an inverter apparatus I according to the present embodiment. A power source 12, which supplies electric power to the inverter apparatus I, is disposed outside the inverter apparatus I. A host controller 15 such as a CPU, which controls the inverter apparatus I, is also disposed outside the inverter apparatus I. The inverter apparatus I, the power source 12, and the host controller 15 are collectively called an inverter control system.

A motor 13, which is controlled by the inverter apparatus I, and a position detector 14, which detects a position of a motor, are disposed outside the inverter apparatus I. The inverter apparatus I, the motor 13, and the position detector 14 are collectively called a motor control system, or a system further including the power source 12 and the host controller 15 may be called a motor control system.

An inverter apparatus I according to the present embodiment includes a controller C, a converter 1, and an inverter 3. The controller C includes a smoothing capacitor 2, a current detector 4, a velocity controller 5, a current limiter 6, a current controller 7, an overload protector 8, an estimator 9, a mode switch 10, a d/q-axis current commander 11, and temperature sensors 16 and 17. In the present embodiment, at least the inverter 3 is mounted on a heat sink, which is not illustrated in FIG. 1. The inverter 3 includes a plurality of power semiconductor devices, and is modularized. This module may be called a power module. The structure of a power module, which is well-known, is not described in detail here. If the entire inverter apparatus I is modularized, the module may be called an inverter module.

The converter 1, which is connected to the power source 12, transforms the voltage of electric power and supplies the electric power to the inverter 3. A smoothing capacitor 2 is serially connected between the converter 1 and the inverter 3.

The inverter 3 converts DC power so that the motor 13 can operate in accordance with a command, and supplies the power to the motor 13.

The velocity controller 5 generates a current command signal from a velocity command sent from the host controller 15 and a velocity command generated from a position signal sent from the position sensor 14, and supplies the current command signal to the current limiter 6 through the mode switch 10. The current limiter 6 generates a new current command in response to the current command signal. The current controller 7 generates a voltage command by using the current signal generated by the current detector 14, generates a PWM gate signal drive, and drives the power semiconductor device installed in the inverter 3.

The inverter 3 includes a sensor 16 for detecting the temperature of the inverter 3. The sensor 16 measures the temperature of the heat sink (ambient temperature) in the environment in which the inverter is installed. The overload protector 8 estimates the junction temperature of the semiconductor device of the inverter 3 from the motor current detected by the current detector 4 and the ambient temperature. The overload protector 8 calculates the current limit value for the motor on the basis of the estimated temperature. In accordance with the calculation result, the current limiter 6 generates a stop signal for stopping driving of the motor, and outputs the signal to the current controller 7. In response to this, the current controller 7 controls driving of the semiconductor device of the inverter 3, and protects the inverter 3 from overload.

Figure 2:
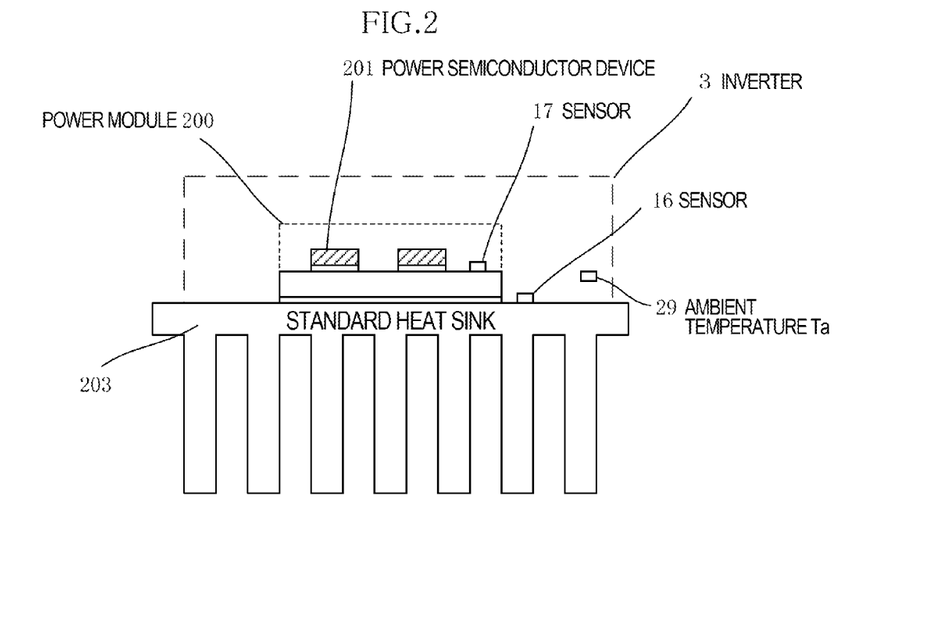
FIG. 2 is a schematic sectional view of an inverter according to the embodiment of the present invention.

As illustrated in FIG. 2, the inverter apparatus I includes a sensor 17 that detects the temperature of a power module 200. The sensor 17 measures the temperature of the power module 200 of the inverter 3 including a power semiconductor device 201. As illustrated in FIG. 2, the sensor 16 is disposed in the case of the inverter 3, and measures the temperature of air in the case of the inverter 3. As illustrated in FIG. 2, the inverter 3 is mounted on a heat sink 203.

Figure 3:
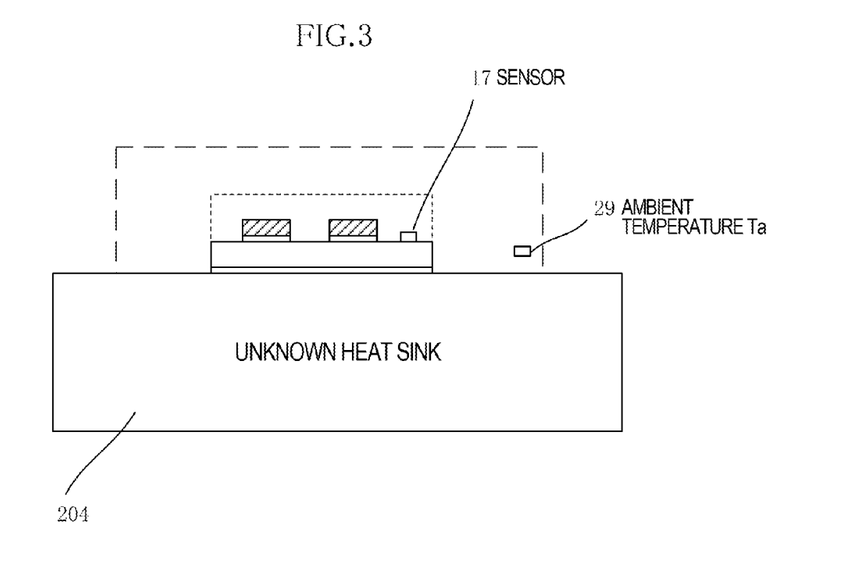
FIG. 3 is a schematic sectional view of the inverter according to the embodiment of the present invention.

The estimator 9 has a function of calculating the thermal resistance and the thermal capacity of an unknown heat sink 204 illustrated in FIG. 3. The estimator 9 estimates the thermal resistance and the thermal capacity of the heat sink 204 by comparing the motor current with the ambient temperature of the inverter 3 and data on the thermal resistance and the thermal capacity of the standard heat sink 203. Here, the term "unknown heat sink" refers to a heat sink whose data on the thermal resistance and the thermal capacity has not been obtained. The term "standard heat sink" refers to a heat sink whose data on the thermal resistance and the thermal capacity has been obtained. The estimator 9 includes a storage that stores the values (standard values) of the thermal resistance and the thermal capacity of the standard heat sink 203.

The estimated values calculated by the estimator 9 are input to the overload protector 8, and the overload protector 8 calculates the junction temperature of the semiconductor device 201 of the inverter 3 by using a thermal equivalent circuit including a motor current, the ambient temperature of the inverter 3, and the estimated thermal resistance and the estimated thermal capacity of the unknown heat sink. The current limiter 6 performs current limiting on the basis of a current limit value for the motor derived from the calculation result, whereby the inverter 3 is protected from overload. In the present embodiment, this protection may be referred to as overload protection.

The mode switch 10 and the d/q-axis current commander 11 have a function of increasing the temperature of the inverter 3 by energizing the motor 13 without rotating the motor 13 in order to estimate the thermal resistance and the thermal capacity of the unknown heat sink 204.

With the inverter apparatus I, in a normal mode, a velocity command is sent from the host controller 15 through the velocity controller 5 to the current limiter 6, which performs current limiting on the velocity command. The current controller 7 converts the velocity command to a current command, generates a PWM gate signal, transmits the command for driving the semiconductor device 201 of the inverter 3, and the motor 13 is driven. In an estimation mode for estimating the thermal resistance and the thermal capacity of the unknown heat sink 204, a switching signal from the host controller 15 is sent to the mode switch 10, and a current command from the host controller is directly provided to the d/q-axis current commander 11.

Figure 4:
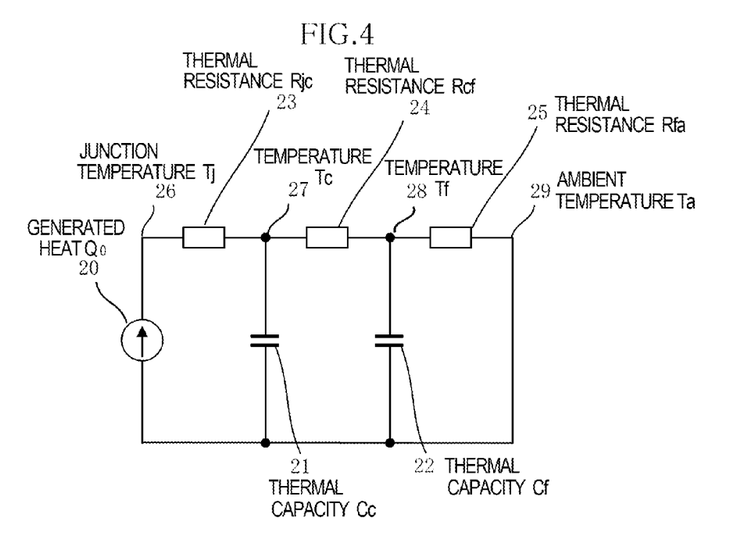
FIG. 4 is a thermal equivalent circuit according to the embodiment of the present invention.

FIG. 4 illustrates a thermal equivalent circuit that is used by the overload protector 8 in order to estimate the junction temperature of the semiconductor device 201 from the ambient temperature of the inverter 3 and the motor current. The elements corresponding to those of FIGS. 2 and 3 are denoted by the same numerals. In FIG. 4, 20 denotes the generated heat $Q_0$, 21 denotes the thermal capacity Cc of the case, 22 denotes the thermal capacity Cf of the heat sink 204, 23 denotes the thermal resistance Rjc between the junction and the case, 24 denotes the thermal resistance Rcf between the case and the heat sink, 25 denotes the thermal resistance Rfa between the heat sink 204 and the ambient temperature, 26 is the junction temperature Tj, 27 is the temperature Tc of the case, 28 is the temperature Tf of the heat sink 204, and 29 is the ambient temperature Ta.

First, estimation of an increase in the temperature of the standard heat sink 203 on the basis of the thermal equivalent circuit will be described. The saturation temperature Tf of the standard heat sink can be represented by the following equation.

$$Tf = Ta + Rfa \times Q \quad (1)$$

The temperature Tf' of the heat sink 203 at time t1 in a transient state between the time when the motor current is started to be applied and the time when the temperature saturates can be represented by the following equation.

$$Tf' = Ta + Rfa \cdot Q[1 - e(-t1/(Rfa \cdot Cf))] \quad (2)$$

Therefore, when a certain value is input to the generated heat Q in the thermal equivalent circuit illustrated in FIG. 4, in order to estimate the junction temperature Tj, the temperature Tf of the heat sink, and the temperature Tf' of the heat sink in the transient state, it is necessary to estimate the thermal resistance Rfa between the heat sink and the ambient temperature, and the thermal capacity Cf of the heat sink, because the thermal resistance Rjc between the junction of the semiconductor device 201 and the case, the thermal resistance Rcf between the case and the heat sink, and the thermal capacity Cc of the case are known.

Figure 5:
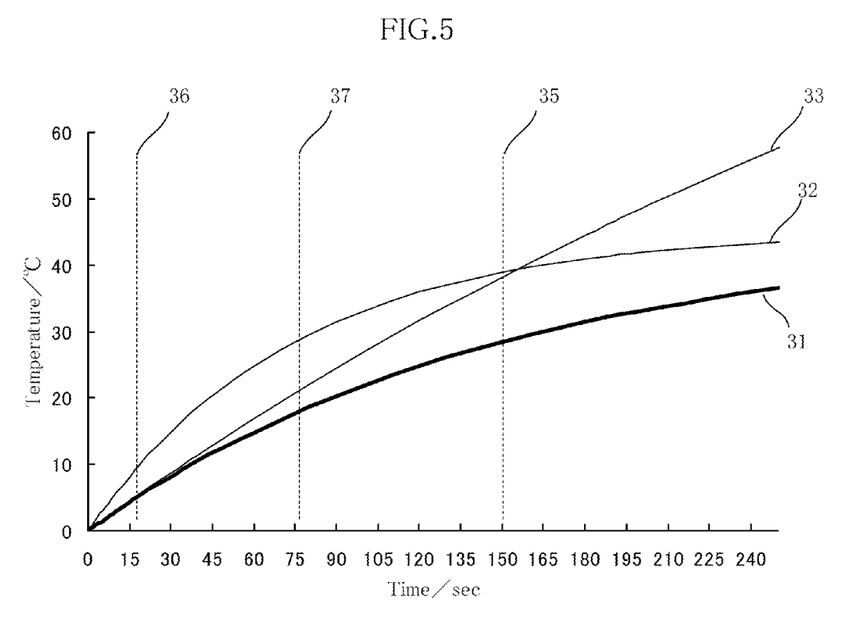
FIG. 5 is a graph illustrating the variation in the temperature of a heat sink according to the embodiment of the present invention.

Next, referring to FIG. 5, a method of estimating the thermal resistance and the thermal capacity of the unknown heat sink 204 will be described. In FIG. 5, 31 denotes the temperature variation of the standard heat sink 203, 32 denotes the temperature variation of an unknown heat sink 204-1, 33 denotes the temperature variation of an unknown heat sink 204-2, 35 denotes the thermal time constant τ of the standard heat sink, 36 denotes the time t1 based on the time constant of the standard heat sink 203, and 37 denotes a time t2 based on the time constant of the standard heat sink 203.

The temperature variation 31 of the standard heat sink 203 and the temperature variations 32 and 33 of the unknown heat sinks can be measured by the sensor 16 of the inverter 3. The estimator 9 stores the thermal resistance Rfa between the standard heat sink 203 and ambient temperature, which is obtained from the temperature variation 31 of the standard heat sink 203, the thermal capacity Cf of the standard heat sink, and the thermal time constant τ35 of the standard heat sink that is calculated from these values.

A method of estimating the thermal resistance and the thermal capacity of an unknown heat sink by using the data stored in the estimator 9 will be described. As an estimation example, the unknown heat sink 204-1 has a thermal resistance the same as the thermal resistance of the standard heat sink 203 and a thermal capacity that is half the thermal capacity of the standard heat sink 203. The unknown heat sink 204-2 has a thermal resistance that is twice the thermal resistance of the standard heat sink and a thermal capacity that is the same as the thermal capacity of the standard heat sink. In order to estimate the thermal capacity by using the temperature variation 32 of the unknown heat sink 204-1 and the temperature variation 33 of the unknown heat sink 204-2, a temperature variation at the time 36 (t1=0.1τ) that is one tenth of the thermal time constant T35 of the standard heat sink is measured.

In regard to the temperature variation of the unknown heat sink at the time t1, which is short relative to the time constant, in a case in which the heat sink has the same thermal capacity as the thermal capacity Cf of the standard heat sink, even if the thermal resistance is different, the temperature variation 33 of the unknown heat sink 204-2 is approximately the same as the temperature variation 31 of the standard heat sink. In contrast, the temperature variation 32 of the unknown heat sink 204-1, which has s thermal capacity that is half the thermal capacity of the standard heat sink, is approximately double the temperature variation of the standard heat sink at the time $\frac{1}{10} \cdot \tau$. That is, the thermal capacity Cfx of the unknown heat sink is estimated by using the following equation from the temperature variation Tt1 of the standard heat sink and the temperature variation Tt1X of the unknown heat sink at time $\frac{1}{10}\tau$. Here, CfX denotes the thermal capacity of the unknown heat sink, and Cf denotes the thermal capacity of the standard heat sink.

$$Cfx = Cf \cdot Tt1/Tt1X \quad (3)$$

Next, a method of estimating the thermal resistance Rfax between the unknown heat sink and the ambient temperature, which is another variable, will be described. Temperature variations Tt2x (32 and 33) of the unknown heat sinks at the time t2 (t2=0.5τ) which is half the time constant τ of the standard heat sink, is measured. These values and the thermal capacity Cfx of the unknown heat sink, which has been estimated as described above, are input to the equation (2). The thermal resistance Rfax of the unknown heat sink can be estimated by performing calculation using equation (2). If there is no difference between the temperature variation of the unknown heat sink and the temperature variation 31 of the standard heat sink at time t2, the temperature variation is measured again at time t3 that is equal to the thermal time constant τ of the standard heat sink. If there is no difference from the temperature variation 31 of the standard heat sink at the time τ, the thermal resistance Rfax of the unknown heat sink is estimated to be the same as Rfa. If there is a difference from the temperature variation 31 at time τ, Rfax is estimated by performing calculation using equation (2) in the same manner. It is not necessary that the measurement time t3 be the same as the time constant τ of the standard heat sink.

Figure 6A:
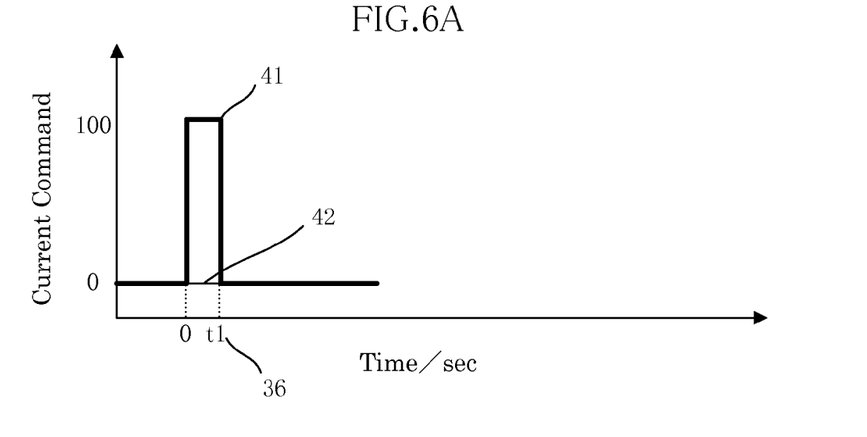
FIGS. 6A to 6C are graphs illustrating current command sequences according to the embodiment of the present invention.
Figure 6B:
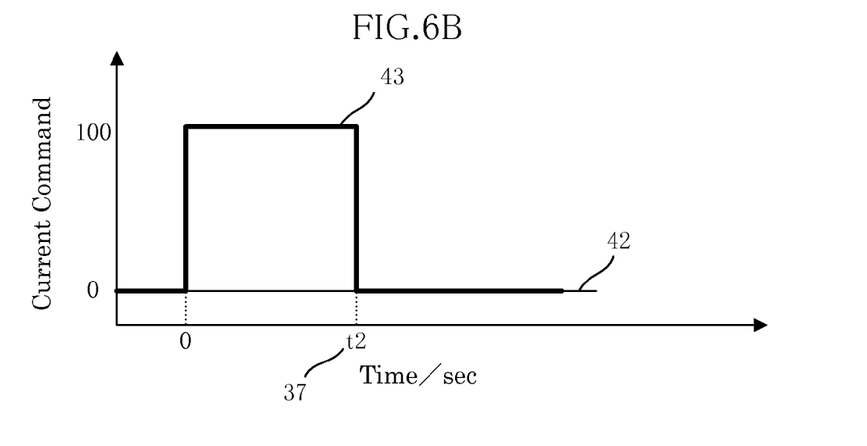
Figure 6C:
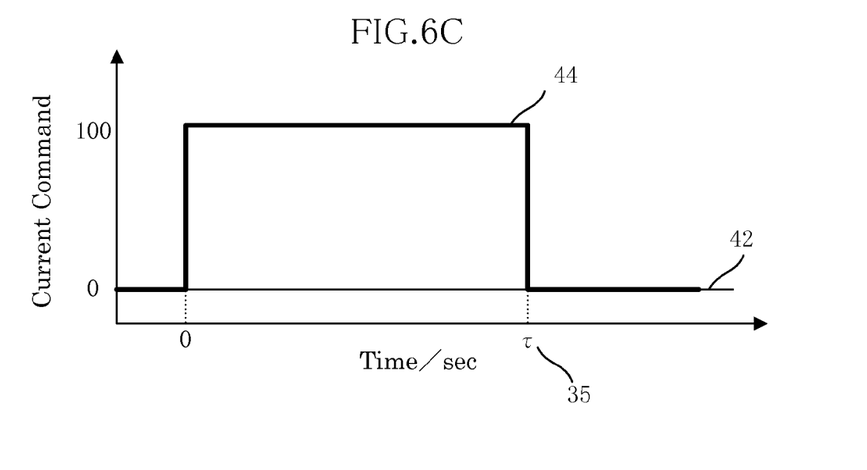

Next, referring to FIGS. 1 and 6, current command patterns with which the estimator 9 performs estimation will be described. FIG. 6A illustrates a current command pattern for energizing only for a period of the time t1 (0.1τ), FIG. 6B illustrates a current command pattern for energizing only for a period of the time t2 (0.5τ), and FIG. 6C illustrates a current command pattern for energizing only for a period of the time τ, in which 41 denotes an Id-axis command value 1, 42 denotes an Iq-axis command value 1, 43 denotes an Id-axis command value 2, and 44 denotes an Id-axis command value 3.

In order to estimate the thermal resistance and the thermal capacity of a heat sink, it is necessary to supply a command having a certain current for a certain period of time. Moreover, it is necessary to energize the motor on the basis of the current command pattern without rotating the motor, because a motor is usually installed in a system. A method for performing this will be described below.

First, the phase angle of the motor is moved to a predetermined position. Referring to FIG. 1, a command is issued to the velocity controller 5 in a normal velocity command mode, and the phase angle of the motor 13 is adjusted to a specific phase angle on the basis of the signal of the position sensor 14.

Next, the host controller 15 sends a signal to the control mode switch 10, the control mode is changed so that the normal velocity control that performs a current control is temporarily stopped, the d/q-axis current commander 11 directly supplies a current command value to the inverter 3, and a motor current is generated. At this time, as illustrated in FIG. 6A, a command signal having the same magnitude as the rating current is supplied, for a period of the time t1, to the Id-axis that generates a reactive current of a motor. At this time, a zero current command is supplied, for a period of the time t1, to the Iq-axis that generates an active current for the motor.

Thus, a gate signal of each phase of the semiconductor device functions so that a current corresponding to the phase angle of the motor is distributed to the coil of the motor in accordance with the magnitude of the Id current command. At this time, the motor can be energized without being rotated, because the zero current command is supplied to the Iq-axis that generates an active current for the motor. The thermal resistance and the thermal capacity of an unknown heat sink can be calculated by, as in the case of FIG. 6A, changing the length of the time period of the current command as illustrated in FIGS. 6B and 6C.

Figure 7:
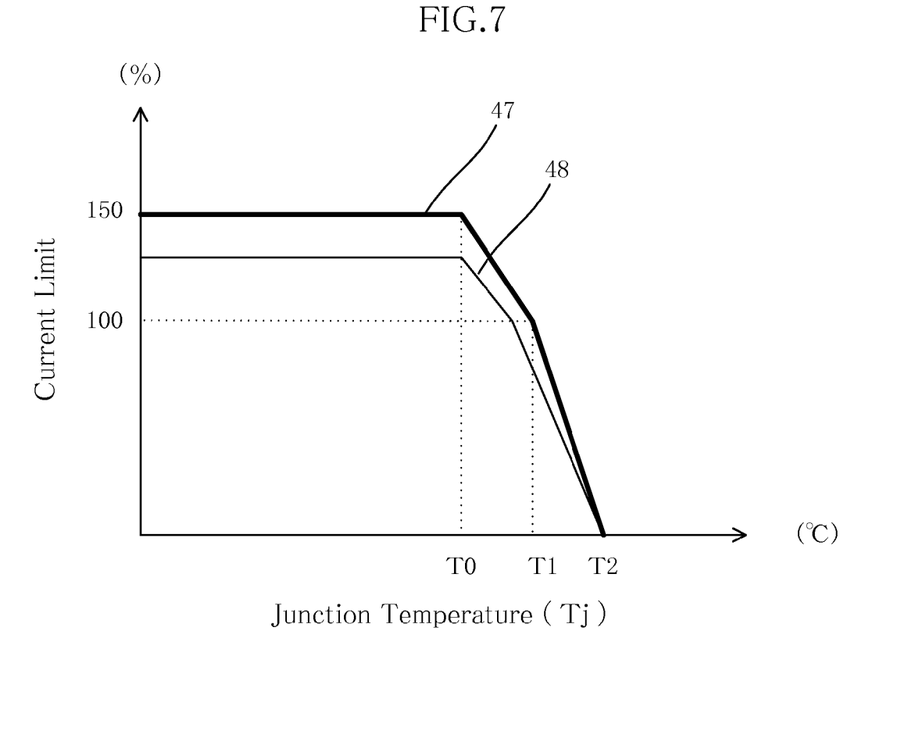
FIG. 7 is a graph illustrating current limit curves for overload protection according to the embodiment of the present invention.

Next, referring to FIG. 7, a method of providing a current limit to the overload protector 8 by using the estimated thermal resistance and the estimated thermal capacity of the unknown heat sink will be described. In FIG. 7, 47 denotes a current limit curve for overload protection of the standard heat sink, and 48 denotes a current limit curve for overload protection of an inverter mounted on the unknown heat sink 204-1. The current limit curve 48 is obtained by multiplying the current limit curve of the overload protection of the standard heat sink by the reciprocal of the ratio of the temperature estimate of the temperature variation 32 at the time constant t1, which is calculated from the estimated values of the thermal resistance and the thermal capacity of the unknown heat sink 204-1, and the temperature data on the standard heat sink. The derated curve is set as the current limit curve 48 for overload protection of the unknown heat sink, data for the overload protector illustrated in FIG. 1 is automatically updated, and overload protection is performed. Thus, an inverter apparatus that can automatically set the current limit value of the heat sink is realized.

According to the present embodiment, the inverter mounted on an unknown heat sink can be effectively protected from an overload state, because the values of the thermal resistance and the thermal capacity of the heat sink can be estimated. Moreover, the estimated values can be automatically changed on the basis of the temperature of the inverter, because the estimated values are calculated on the basis of the temperature of the inverter and driving of the inverter is controlled on the basis of the estimated values.

According to the present embodiment, a change in the thermal characteristic and a change in the environment can be estimated with a high precision, because the standard values of the thermal resistance and the thermal capacity of a standard heat sink are stored.

According to the present embodiment, an inverter mounted on an unknown heat sink can be effectively protected from an overload state.

According to the present embodiment, a motor current can be applied without rotating the motor, because a current commander that is independent of a current controller is provided. That is, the temperature of an inverter can be increased without rotating the motor, and the estimated values are calculated.

According to the present embodiment, the thermal resistance and the thermal capacity of an unknown heat sink can be efficiently estimated, because the second current command corresponds to a plurality of command patterns of operating times based on the thermal time constant that is calculated from the standard values.

According to the present embodiment, a current limit curve for overload protection of an unknown heat sink can be automatically set by derating a current limit curve for overload protection of the standard heat sink by using temperature data estimated from the standard values of the thermal resistance and the thermal capacity of a standard heat sink. Therefore, overload protection can be effectively performed while maintaining a high performance of a power module, even when the installation environment of the inverter apparatus changes or the thermal property of a heat sink changes.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. An inverter apparatus comprising:
   a heat sink;
   a first detector that detects a temperature of the heat sink;
   an inverter including a power module including a semiconductor device, the inverter being attached to the heat sink;
   a second detector that detects a temperature of the power module;
   an estimator that calculates estimated values of a thermal resistance and a thermal capacity of the heat sink on the basis of the temperature detected by the second detector; and
   a controller that controls driving of the inverter on the basis of the estimated values.

2. The inverter apparatus according to claim 1, wherein the inverter is protected from overload by limiting the driving of the inverter.

3. The inverter apparatus according to claim 2, wherein the estimator includes a storage that stores standard values of a thermal resistance and a thermal capacity of a standard heat sink.

4. The inverter apparatus according to claim 3, wherein the estimator calculates the estimated values by calculating a junction temperature of the semiconductor device on the basis of the standard values.

5. The inverter apparatus according to claim 4,
   wherein the controller includes
   a current controller that supplies a first current command to the inverter in a normal mode,
   a current commander that supplies a second current command to the inverter in an estimation mode in which the estimator calculates the estimated values, and
   a switch that switches between the normal mode and the estimation mode in response to a switching signal.

6. The inverter apparatus according to claim 5, wherein the second current command corresponds to a plurality of command patterns of operating times based on a thermal time constant that is calculated from the standard values.

7. The inverter apparatus according to claim 6, wherein a current limit value of the heat sink is automatically set on the basis of the estimated values.

8. An inverter control system connected to the inverter apparatus according to claim 7, the inverter control system including a controller that supplies the switching signal to the switch.

9. A motor control system comprising:
   a motor connected to the inverter apparatus according to claim 7,
   wherein, in the estimation mode, the inverter apparatus increases a temperature of the inverter by energizing the motor without rotating the motor in response to the second current command.

10. A method of controlling an inverter apparatus, the method comprising the steps of:
    preparing a heat sink;
    attaching an inverter to the heat sink, the inverter including a power module including a semiconductor device;
    measuring a temperature of the heat sink;
    detecting a temperature of the power module;
    calculating estimated values of a thermal resistance and a thermal capacity of the heat sink on the basis of the temperature of the power module that has been detected; and
    limiting driving of the inverter on the basis of the estimated values.

11. The method of controlling an inverter apparatus according to claim 10, wherein the inverter is protected from overload by limiting driving of the inverter.

12. The method of controlling an inverter apparatus according to claim 11, wherein, in the step of calculating the estimated values, the estimated values are calculated on the basis of standard values of a thermal resistance and a thermal capacity of a standard heat sink.

13. The method of controlling an inverter apparatus according to claim 12,
    wherein a motor is connected to the inverter, and
    wherein, in the step of calculating the estimated values, a temperature of the inverter is increased by energizing the motor without rotating the motor.

14. An inverter apparatus comprising:
    a heat sink;
    an inverter including a semiconductor device, the inverter being attached to the heat sink;
    a detector that detects a temperature of the inverter;

an estimator including a storage that stores standard values of a thermal resistance and a thermal capacity of a standard heat sink, the estimator calculating estimated values of a thermal resistance and a thermal capacity of the heat sink on the basis of the temperature detected by the detector and the standard values; and a controller that protects the inverter from overload by limiting the driving of the inverter on the basis of the estimated values.

15. A method of controlling an inverter apparatus, the method comprising:

attaching a heat sink to an inverter;

measuring a temperature of the inverter;

calculating estimated values of a thermal resistance and a thermal capacity of the heat sink on the basis of a temperature of the inverter that has been detected and standard values of a thermal resistance and a thermal capacity of a standard heat sink; and protecting the inverter from overload by limiting the driving of the inverter on the basis of the estimated values.

* * * * *